US 6,737,746 B2

(12) United States Patent
Matsuura

(10) Patent No.: US 6,737,746 B2
(45) Date of Patent: May 18, 2004

(54) SEMICONDUCTOR DEVICE CONTAINING COPPER DIFFUSION PREVENTIVE FILM OF SILICON CARBIDE

(75) Inventor: Masazumi Matsuura, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/216,818

(22) Filed: Aug. 13, 2002

(65) Prior Publication Data
US 2003/0089988 A1 May 15, 2003

(30) Foreign Application Priority Data
Nov. 14, 2001 (JP) ........................................ 2001-348736

(51) Int. Cl.[7] .................. H01L 23/48; H01L 23/52; H01L 29/40
(52) U.S. Cl. .................. 257/759; 257/762; 257/751; 257/758
(58) Field of Search ................ 257/759, 762, 257/751, 758

(56) References Cited

U.S. PATENT DOCUMENTS

| 6,593,655 B1 | * | 7/2003 | Loboda et al. | 257/760 |
| 2002/0137323 A1 | * | 9/2002 | Loboda | 438/600 |
| 2003/0077916 A1 | * | 4/2003 | Xu et al. | 438/778 |

FOREIGN PATENT DOCUMENTS

| JP | 62-250655 | 10/1987 |
| JP | 7-235532 | 9/1995 |
| JP | 8-319186 | 12/1996 |

OTHER PUBLICATIONS

T. Ishimaru, et al., "Development of Low–K Copper Barrier Films Deposited by PE–CVD Using HMDSO, $N_2O$ and $NH_3$", IEEE 2001, pp. 36–38.

* cited by examiner

Primary Examiner—Phat X. Cao
(74) Attorney, Agent, or Firm—Oblon, Spivak, McClelland, Maier & Neustadt, P.C.

(57) ABSTRACT

It is an object to provide a semiconductor device having a copper wiring structure in which a copper diffusion preventing capability of a silicon carbide film can be improved and a lifetime maintained until a dielectric breakdown caused by copper diffusion can be increased, and furthermore, a method of manufacturing the semiconductor device. A first copper diffusion preventive film (8) is provided between a first copper wiring (7) and a second low permittivity interlayer insulating film (9). A silicon carbide film containing oxygen atoms or the oxygen atoms and nitrogen atoms in 30 atomic % or more is employed for the first copper diffusion preventive film (8). By employing such a silicon carbide film, a copper diffusion preventing function can be improved and a lifetime maintained until a dielectric breakdown caused by the copper diffusion can be increased.

6 Claims, 10 Drawing Sheets

SEMICONDUCTOR DEVICE CONTAINING COPPER DIFFUSION PREVENTIVE FILM OF SILICON CARBIDE

BACKGROUND OF THE INVENTION

1. Field of the Invention

The present invention relates to a semiconductor device utilizing a copper wiring and a method of manufacturing the semiconductor device.

2. Description of the Background Art

In a system LSI in the 0.13 $\mu$m gate generation and subsequent thereto, it is important that a signal delay of a device should be reduced to implement an increase in the speed of the device. The signal delay of the device is represented by the sum of a signal delay of a transistor and a wiring delay. As a wiring pitch is reduced rapidly, the influence of the wiring delay becomes greater than that of the signal delay of the transistor.

Since the wiring delay is proportional to a product of RC (a resistance by an interlayer electrostatic capacity), it is necessary to reduce a wiring resistance or to decrease a capacity of an interlayer insulating film in order to relieve the wiring delay. In order to solve the problem, accordingly, there has been vigorously studied a buried wiring structure employing a combination of a low permittivity interlayer insulating film and a copper wiring having a low resistance.

FIG. 19 is a view showing a semiconductor device having a general buried copper wiring structure according to a conventional example. In the semiconductor device, a copper wiring having two layers is formed.

More specifically, a lower insulating layer 112 including an element (not shown) such as a transistor is formed on a substrate 111 such as a silicon substrate. A first etching stop film 113, a first low permittivity interlayer insulating film 114 and a first hard mask film 115 are formed on the lower insulating layer 112.

The first etching stop film 113 serves to stop etching when forming a wiring trench in the first low permittivity interlayer insulating film 114. Moreover, the first hard mask film 115 is used as a hard mask (a mask formed of a stronger material than a photoresist) for forming the wiring trench in the first low permittivity interlayer insulating film 114.

A wiring trench is formed in the first low permittivity interlayer insulating film 114 and the first hard mask film 115, in which a first barrier metal 116 and a first copper wiring 117 are formed.

In the structure, furthermore, a first copper diffusion preventive film 118, a second low permittivity interlayer insulating film 119, a second etching stop film 120, a third low permittivity interlayer insulating film 121, and a second hard mask film 122 are formed.

The first copper diffusion preventive film 118 is provided for preventing the diffusion of copper. The copper is diffused into an insulating film more easily than a material such as aluminum, titanium or tantalum. When a large amount of copper is diffused into the interlayer insulating film, the interlayer insulating film causes a dielectric breakdown. Therefore, it is necessary to prevent the diffusion of the copper.

A silicon nitride film (a relative permittivity of 6.5 to 8.0) having a copper diffusion preventing capability, a silicon carbide film (a relative permittivity of 4.5 to 5.0) or the like is employed for the first copper diffusion preventive film 118. It is preferable to employ a silicon carbide film having a great effect of decreasing the capacity of the interlayer insulating film (that is, a low relative permittivity).

The second etching stop film 120 serves to stop etching when forming a wiring trench in a third low permittivity interlayer insulating film 121.

Moreover, a second hard mask film 122 is used as a hard mask for forming a wiring trench in the third low permittivity interlayer insulating film 121.

A wiring trench is formed in the third low permittivity interlayer insulating film 121 and the second hard mask film 122, and furthermore, a connecting hole is formed in a part of the second etching stop film 120 exposed to a wiring trench 124 and the third low permittivity interlayer insulating film 119. A second barrier metal 125 and a second copper wiring 126 are formed in the wiring trench and the connecting hole.

Furthermore, a second copper diffusion preventive film 127 is formed in the structure. Examples of an applicable material to this film include a silicon nitride film, a silicon carbide film and the like. It is preferable to apply the silicon carbide film having a great effect of decreasing a capacity of an interlayer insulating film in the same manner as the first copper diffusion preventive film 118.

In a semiconductor device employing the copper wiring, it is preferable that the silicon carbide film should be applied as the copper diffusion preventive film as described above. As compared with a silicon nitride film to be another candidate material, the silicon carbide film has a lower relative permittivity and produces the greater effect of decreasing the capacity of the interlayer insulating film.

However, the silicon carbide film cannot completely prevent copper from being diffused. For example, a copper diffusion preventing function becomes insufficient due to the presence of an impurity in the silicon carbide film and the copper diffusion preventing function is deteriorated by a secular change.

In order to enhance the reliability of the semiconductor device, therefore, it is always required that the copper diffusion preventing capability of the silicon carbide film should be enhanced and the insulating film should have a long lifetime maintained until a dielectric breakdown is caused by the diffusion of the copper.

SUMMARY OF THE INVENTION

It is an object of the present invention to provide a semiconductor device having a copper wiring structure in which a copper diffusion preventing capability of a silicon carbide film can be improved and a lifetime maintained until a dielectric breakdown is caused by copper diffusion can be increased, and furthermore, a method of manufacturing the semiconductor device.

An aspect of the present invention is directed to a semiconductor device including an interlayer insulating film, an electric conductor containing copper as a main component, and a silicon carbide film. The silicon carbide film is provided between the electric conductor and the interlayer insulating film, and the silicon carbide film contains oxygen atoms in 30 atomic % or more.

According to the present invention, the silicon carbide film contains oxygen atoms in 30 atomic % or more. Consequently, it is possible to improve the function of the silicon carbide film for preventing copper employed for the electric conductor from being diffused into the interlayer insulating film. Thus, it is possible to obtain a semiconductor device which maintains a long lifetime until a dielectric breakdown is caused by the diffusion of the copper.

Preferably, in the semiconductor device according to the present invention, the silicon carbide film also contains nitrogen atoms, and the silicon carbide film contains oxygen atoms and nitrogen atoms in 30 atomic % or more.

According to the present invention, the silicon carbide film also contains nitrogen atoms. The silicon carbide film contains oxygen atoms and nitrogen atoms in 30 atomic % or more. Also in this case, the same effects as those in the above-mentioned aspect of the present invention can be obtained.

These and other objects, features, aspects and advantages of the present invention will become more apparent from the following detailed description of the present invention when taken in conjunction with the accompanying drawings.

DESCRIPTION OF THE PREFERRED EMBODIMENTS

<First Embodiment>

The present embodiment provides a semiconductor device in which a silicon carbide film contains oxygen atoms or the oxygen atoms and nitrogen atoms in 30 atomic % or more to improve the copper diffusion preventing function of the silicon carbide film and to increase a lifetime maintained until a dielectric breakdown caused by copper diffusion, and a method of manufacturing the semiconductor device.

Figure 4:
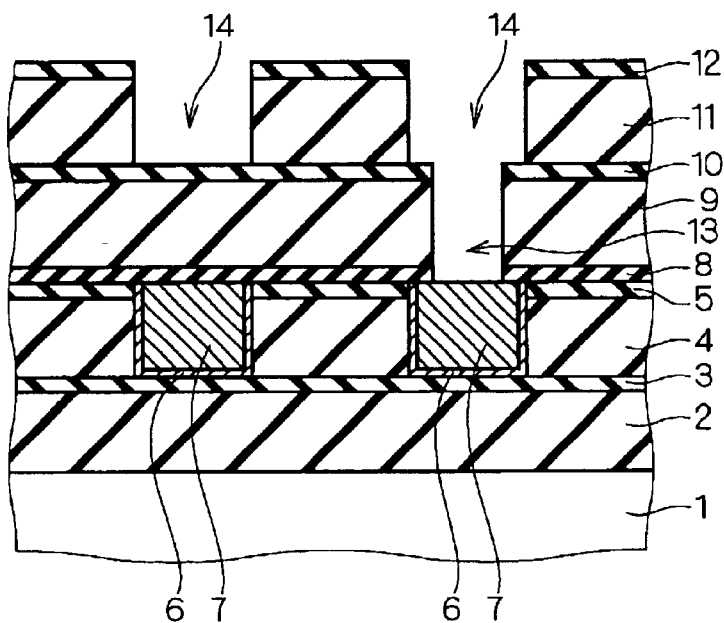
Figure 5:
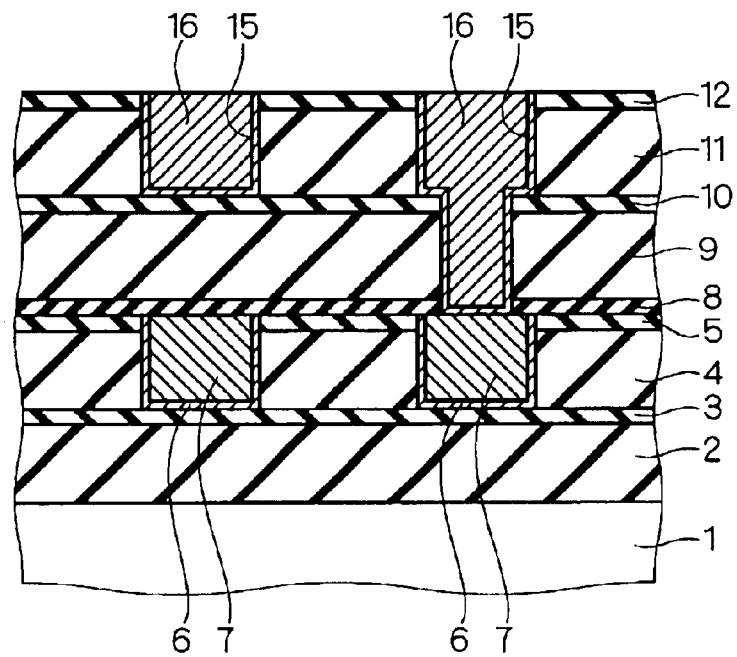
Figure 6:
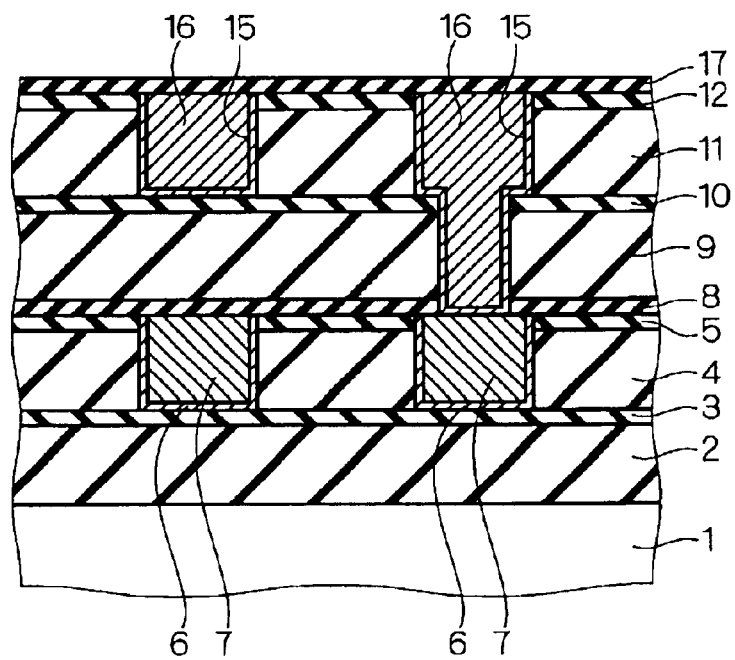
FIG. 6 is a view showing the semiconductor device according to the first embodiment.

FIGS. 1 to 5 are views showing the method of manufacturing the semiconductor device according to the present embodiment and FIG. 6 is a view showing the semiconductor device obtained by the manufacturing method. In the present embodiment, a process flow for forming a copper wiring having two layers is illustrated. Description will be sequentially given with reference to FIG. 1 and subsequent drawings.

Figure 1:
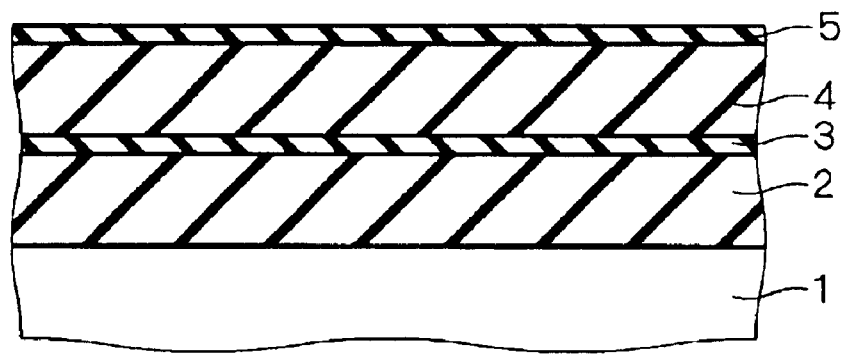
FIGS. 1 to 5 are views showing one step of a method of manufacturing a semiconductor device according to a first embodiment.

First of all, a lower insulating layer 2 including an element such as a transistor (not shown) is formed on a substrate 1 such as a silicon substrate. Then, a first etching stop film 3, a first low permittivity interlayer insulating film 4 and a first hard mask film 5 are formed on the lower insulating layer 2 (FIG. 1). In the present embodiment, a structure having the substrate 1 and the lower insulating layer 2 is regarded as a lower structure of a wiring formation layer.

Moreover, the first etching stop film 3 serves to stop etching when forming a wiring trench in the first low permittivity interlayer insulating film 4. The first etching stop film 3 is to reliably stop the etching of the wiring trench. In other words, it is desirable that a material having a much lower etching speed on a certain etching condition than an etching speed of the first low permittivity interlayer insulating film 4 should be applied to the first etching stop film 3.

For example, a silicon oxide film, a silicon nitride film, a silicon carbide film or the like is employed for the first etching stop film 3. The three kinds of films have a feature that a high etching selection ratio can easily be obtained if the following various low permittivity interlayer insulating films are used for etched films.

Moreover, at least one of the following various insulating films is employed for the first low permittivity interlayer insulating film 4. For example, it is possible to employ hydrogen silsesquioxane, methyl silsesquioxane, polyarylether, aromatic polymer, benzocyclobutene, polytetrafluoroethylene and the like. In addition, it is also possible to use a material formed by a spin coating method such as xerogel to be porous silica or aerogel or a material formed by CVD (Chemical Vapor Deposition) such as a silicon oxide fluoride film (SiOF film), fluorinated amorphous carbon (CF film), palylene, boron nitride (BN film) or a silicon oxide carbide film (SiOC film). The low permittivity interlayer insulating films have relative permittivity of approximately 1.8 to 3.0.

Moreover, a silicon nitride film, a silicon oxide film, a silicon oxide nitride film, a silicon carbide film and the like are used for the first hard mask film 5, for example. The first hard mask film 5 is used as a hard mask for forming a wiring trench in the first low permittivity interlayer insulating film 4, and furthermore, prevents the first low permittivity interlayer insulating film 4 provided thereunder from being directly exposed to CMP (Chemical Mechanical Polishing) during the wiring formation.

Figure 2:
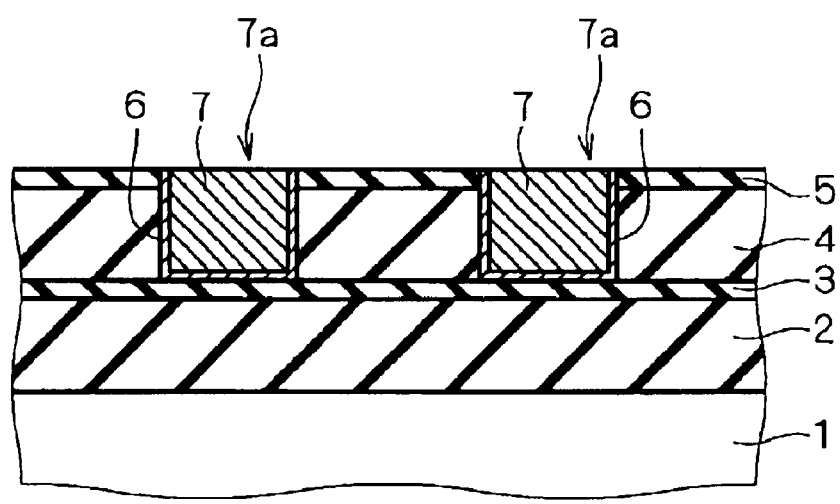
Figure 3:
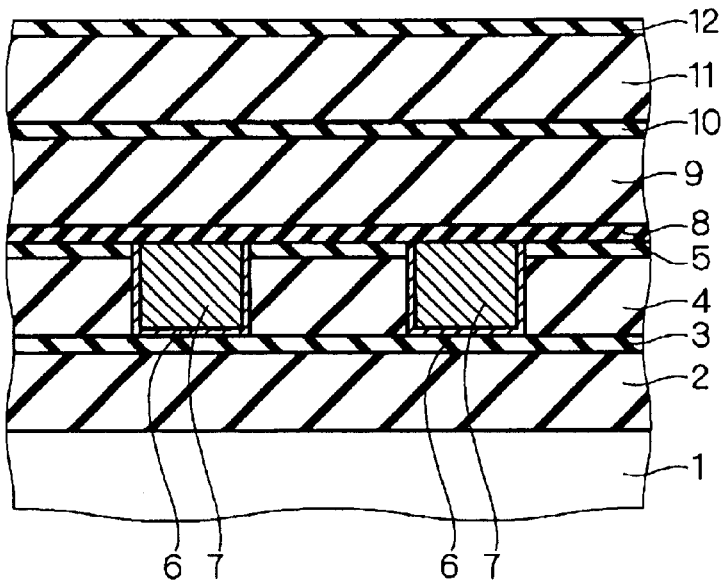

Next, the first hard mask film 5 is subjected to patterning by photolithography and the first low permittivity interlayer insulating film 4 is subjected to dry etching by using the patterned first hard mask film 5 as a mask, thereby forming a wiring trench 7a. Then, a first barrier metal 6 and a first copper wiring 7 are formed in this order and a portion provided above the first hard mask film 5 is removed by CMP to leave them in only the wiring trench 7a (FIG. 2). The first barrier metal 6 is formed in contact with the first copper wiring 7 along an internal wall of the wiring trench 7a.

While the first etching stop film 3 is formed on the lower structure, it may be provided during the formation of the first low permittivity interlayer insulating film 4 corresponding to a depth of the wiring trench 7a.

For example, tantalum nitride is employed for the first barrier metal 6. The tantalum nitride is formed by sputtering or CVD. Moreover, the first copper wiring 7 is formed by the sputtering or plating. The tantalum nitride has a barrier metal function of preventing the diffusion of copper from the first copper wiring 7 into the first low permittivity interlayer insulating film 4.

A first copper diffusion preventive film 8, a second low permittivity interlayer insulating film 9, a second etching stop film 10, a third low permittivity interlayer insulating film 11 and a second hard mask film 12 are formed in this order over the structure obtained by the steps described above (FIG. 3).

In the present embodiment, a silicon carbide film containing oxygen atoms or oxygen atoms and nitrogen atoms in 30 atomic % or more is employed for the first copper diffusion preventive film 8. Description will be given to an advantage that such a silicon carbide film is employed.

Moreover, the same various low permittivity interlayer insulating films as the first low permittivity interlayer insulating film 4 are employed for the second and third low permittivity interlayer insulating films 9 and 11.

Furthermore, the second etching stop film 10 serves to stop etching when forming a wiring trench in the third low permittivity interlayer insulating film 11 in the same manner as the first etching stop film 3. The material of such a film is also required for easily taking a high etching selection ratio to the third low permittivity interlayer insulating film 11. In the same manner as the first etching stop film 3, for example, a silicon oxide film, a silicon nitride film, a silicon carbide film and the like are employed for the second etching stop film 10.

Moreover, the second hard mask film 12 has the function to be the same hard mask film as the first hard mask film 5, and furthermore, prevents the third low permittivity interlayer insulating film 11 provided thereunder from being directly exposed to CMP. A silicon nitride film, a silicon oxide film, a silicon oxide nitride film, a silicon carbide film and the like can be applied to the second hard mask film 12 in the same manner as the first hard mask film 5.

Next, the second hard mask film 12 is subjected to patterning by the photolithography and the third low permittivity interlayer insulating film 11 is subjected to dry etching by using the patterned second hard mask film 12 as a mask, thereby forming a wiring trench 14. Moreover, a part of the second etching stop film 10 exposed to the wiring trench 14 is subjected to the patterning by the photolithography. The second low permittivity interlayer insulating film 9 and the first copper diffusion preventive film 8 are subjected to dry etching by using the patterned second etching stop film 10 as a mask, thereby forming a connecting hole 13 (FIG. 4).

The second etching stop film 10 is formed in a position corresponding to a depth of the wiring trench 14. Accordingly, in the case in which the second and third low permittivity interlayer insulating films 9 and 11 are regarded as one interlayer insulating film, it can be supposed that the second etching stop film 10 is formed during the formation of the same interlayer insulating film.

In the same manner as the first barrier metal 6 and the first copper wiring 7, then, a second barrier metal 15 and a second copper wiring 16 are formed and a portion provided on the second hard mask film 12 is removed by CMP to leave them in only the connecting hole 13 and the wiring trench 14 (FIG. 5). The second barrier metal 15 is formed in contact with the second copper wiring 16 along internal walls of the connecting hole 13 and the wiring trench 14. Moreover, the first copper wiring 7 is provided in contact with a connecting portion of the second copper wiring 16 which is formed in the connecting hole 13.

Subsequently, a second copper diffusion preventive film 17 is formed in contact with an upper part of the second copper wiring 16 (FIG. 6). In the same manner as the first copper diffusion preventive film, a silicon carbide film containing oxygen atoms or oxygen atoms and nitrogen atoms in 30 atomic % or more is employed for the second copper diffusion preventive film 17.

In the present embodiment, thus, a silicon carbide film containing oxygen atoms or oxygen atoms and nitrogen atoms is applied to the first and second copper diffusion preventive films 8 and 17.

Figure 7:
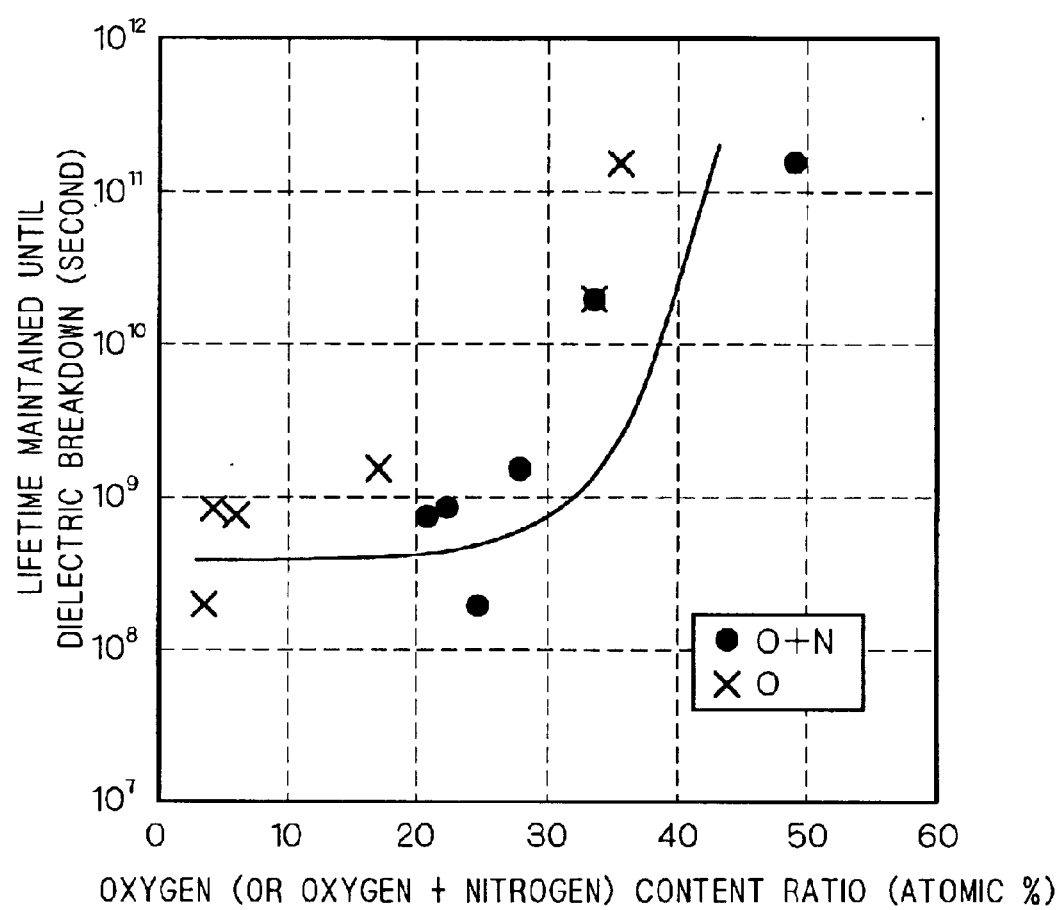
FIG. 7 is a chart showing the relationship between a content ratio of oxygen or the oxygen and nitrogen in a silicon carbide film and a lifetime maintained until a dielectric breakdown is caused.

FIG. 7 is a chart showing the relationship between a content ratio (in a unit of atomic %) of oxygen atoms or oxygen atoms and nitrogen atoms to all composition elements in a silicon carbide film and a lifetime maintained until a dielectric breakdown is caused (in a unit of second). For an experiment shown in FIG. 7, a lifetime maintained until a dielectric breakdown is measured in a following manner. A sample film of the silicon carbide film containing oxygen atoms or containing oxygen atoms and nitrogen atoms is formed on a silicon substrate, a copper electrode is formed on the sample film, and a voltage is applied such that the copper electrode is on a positive side and the silicon substrate is on a negative side (a contact is made from the back face of the substrate). The lifetime maintained until the dielectric breakdown indicates a value obtained when an electric field of 1 MV/cm is applied at an atmosphere temperature of 200° C.

As is apparent from FIG. 7, if a content ratio of oxygen atoms or oxygen atoms and nitrogen atoms is 30 atomic % or more, the lifetime maintained until the dielectric breakdown is rapidly increased. While there are no detailed data with a content ratio of 50% or more, it is possible to form a silicon carbide film having a long lifetime with at least a content ratio of 30% to 50%. It is clear that such a long lifetime cannot be obtained when the same experiment is carried out by using a silicon oxide film or a silicon oxide-nitride film.

The silicon carbide film according to the present embodiment may contain hydrogen atoms in addition to silicon atoms, carbon atoms, oxygen atoms and nitrogen atoms which are main constitutive elements. Even if the silicon carbide film contains hydrogen atoms, the same results are obtained.

It is supposed that the lifetime of the silicon carbide film which is maintained until the dielectric breakdown is brought by diffusion of copper from the copper electrode into the sample film. For example, in the case in which an aluminum electrode is used, a breakdown voltage is not deteriorated in such a short time. In the experiment of FIG. 7, the long lifetime of the silicon carbide film for a high electric field implies that the copper is diffused with difficulty and the diffusion of the copper can be prevented well.

By employing, for a copper diffusion preventive film, a silicon carbide film having a content ratio of oxygen atoms or oxygen atoms and nitrogen atoms set to 30 atomic % or more, accordingly, a copper diffusion preventing function can be improved and a lifetime maintained until a dielectric breakdown is caused by the copper diffusion can be increased.

Next, description will be given to a method of forming the silicon carbide film containing oxygen atoms or oxygen atoms and nitrogen atoms. For a film forming method, a plasma CVD method is used. In order to contain oxygen or oxygen and nitrogen in the silicon carbide film, it is necessary to select a raw material gas containing oxygen and nitrogen.

In order to cause the silicon carbide film to contain oxygen atoms, it is preferable to use organic siloxane or silicon alchoxide or to add oxygen to organic silane ($SiH_nR_{4-n}$, R is an alkyl group ($C_nH_{2n+1}$)).

In order to cause the silicon carbide film to contain oxygen atoms and nitrogen atoms, moreover, it is preferable to add nitrous oxide or a mixed gas of nitrous oxide and ammonia to organic silane or to add nitrous oxide or ammonia or a mixed gas of nitrous oxide and ammonia to organic siloxane or silicon alchoxide. As a matter of course, nitrogen or a mixed gas of ammonia and nitrogen may be used in place of ammonia.

The organic siloxane contains an Si—O bond in a molecular skeleton and can be roughly divided into chain siloxane $(R_{2n+1}(SiO_n)SiR_3$, R is an alkyl group ($C_nH_{2n+1}$) or hydrogen) and cyclic siloxane (($R_2SiO)_n$, R is an alkyl group ($C_nH_{2n+1}$) or hydrogen and n is three or more).

Examples of the chain siloxane applicable to the present invention include HMDSO (Hexamethyldisiloxane: $Si_2O(CH_3)_6$) and OMTS (1,1,1,3,5,7,7,7-Octamethyltetrasiloxane: $Si_4O_3H_2(CH_3)_8$). Moreover, examples of the chain siloxane applicable to the present invention include OMCTS (Octamethylcyclotetrasiloxane: $Si_4O_4(CH_3)_8$) and TMCTS (1,3,5,7-Tetramethylcyclotetrasiloxane: $Si_4O_4(CH_3)_4$).

The silicon alchoxide is silicate represented by TEOS (Tetraethoxysilane: $Si(OC_2H_5)_4$) and is expressed in a chemical formula of $Si(OR)_4$ or $SiR1_n(OR2)_{4-n}$ (R1 is an alkyl group or hydrogen and R2 is the alkyl group). Examples of the silicon alchoxide applicable to the present invention include TMOS (Tetramethoxysilane: $Si(OCH_3)_4$), TMS (Trimethoxysilane: $SiH(OCH_3)_3$) and DMDMOS (Dimethyldimethoxysilane: $Si(CH_3)_2(OCH_3)_2$) in addition to the TEOS.

The above-mentioned raw material gas is used with a regulated flow rate or the like and a plasma is generated in a chamber of a plasma CVD apparatus having a flow rate regulated to approximately 200 Pa. A wafer substrate is mounted on a substrate stage having a stage temperature set to 300 to 400° C. and a silicon carbide film is formed on the wafer substrate. Consequently, it is possible to form a silicon carbide film containing oxygen atoms or oxygen atoms and nitrogen atoms.

The silicon carbide film having a content ratio of oxygen atoms or oxygen atoms and nitrogen atoms set to 30 atomic % or more maintains a long lifetime until a dielectric breakdown as shown in FIG. 7. Therefore, it is possible to enhance the reliability of a semiconductor device by using the silicon carbide film as a copper diffusion preventive film.

While the silicon carbide film is useful for the diffusion of the copper, it is a matter of course that the silicon carbide film also has the function of preventing a diffusion for other metals, for example, aluminum, titanium, tantalum and the like which are less diffused than copper.

According to the semiconductor device in accordance with the present embodiment, the silicon carbide film is employed for the first and second copper diffusion preventive films 8 and 17 and contains oxygen atoms or oxygen atoms and nitrogen atoms in 30 atomic % or more. Consequently, it is possible to improve the function of the silicon carbide film for preventing the diffusion of the copper from a copper wiring. Thus, it is possible to obtain a semiconductor device which maintains a long lifetime until a dielectric breakdown is caused by the diffusion of the copper.

More specifically, in the present embodiment, the silicon carbide film containing oxygen atoms or oxygen atoms and nitrogen atoms is formed as the copper diffusion preventive films 8 and 17 on the copper wirings 7 and 16. Therefore, the upward diffusion of the copper can be prevented. In other words, in case of the first copper diffusion preventive film 8, it is possible to prevent the diffusion of the copper from the first copper wiring 7 into the second low permittivity interlayer insulating film 9 to be an upper layer. Also in case of the second copper diffusion preventive film 17, the diffusion of the copper into the interlayer insulating film can be prevented when the interlayer insulating film is formed as an upper layer.

While a film is not formed on the second copper diffusion preventive film 17 in FIG. 6, the diffusion of the copper is prevented when the same low permittivity interlayer insulating film as the first to third low permittivity interlayer insulating films 4, 9 and 11 is formed on the second copper diffusion preventive film 17 in addition to the function of the second copper diffusion preventive film 17. More specifically, the diffusion of the copper can be prevented by interposing a copper diffusion preventive film between a low permittivity interlayer insulating film and a copper wiring.

According to the method of manufacturing the semiconductor device in accordance with the present embodiment, it is possible to manufacture a semiconductor device having the advantages described above.

Since the first and second copper diffusion preventive films 8 and 17 are provided on the first and second copper wirings 7 and 16 respectively, the above-mentioned effects can also be obtained with a multilayer interconnection.

In the present embodiment, moreover, the first to third low permittivity interlayer insulating films 4, 9 and 11 are first provided and the wiring trenches 7a and 14 and the connecting hole 13 are then provided therein in order to form a wiring. Consequently, a so-called damascene process can be carried out and the present invention is not restricted thereto.

For example, it is also possible to employ such a process that a metal film is provided on the lower structure and is formed to take the shape of a wiring by photolithography and etching, and a low permittivity interlayer insulating film is then formed therearound. Also in that case, if a silicon carbide film containing oxygen atoms or oxygen atoms and nitrogen atoms is interposed between a wiring and a low permittivity interlayer insulating film, the diffusion of the metal can be prevented.

In general, the diameter of the connecting hole 13 of the upper layer is smaller than the width of the first copper wiring 7. Therefore, the first copper diffusion preventive film 8 can effectively prevent the diffusion of the copper from the first copper wiring 7 into the second low permittivity interlayer insulating film 9. Similarly, the second copper diffusion preventive film 17 can effectively prevent the diffusion of the copper.

<Second Embodiment>

The present embodiment is a variant of the semiconductor device and the method of manufacturing the semiconductor device according to the first embodiment, in which a silicon carbide film having a content ratio of oxygen atoms or oxygen atoms and nitrogen atoms set to 30 atomic % or more is applied to other films.

Figure 11:
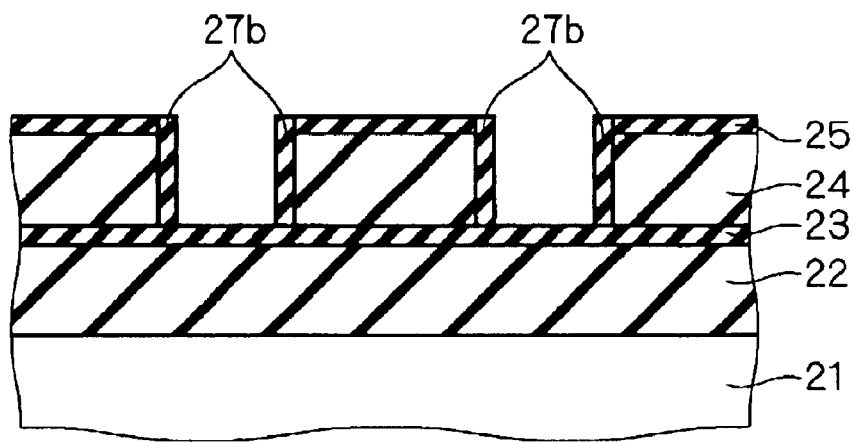
Figure 12:
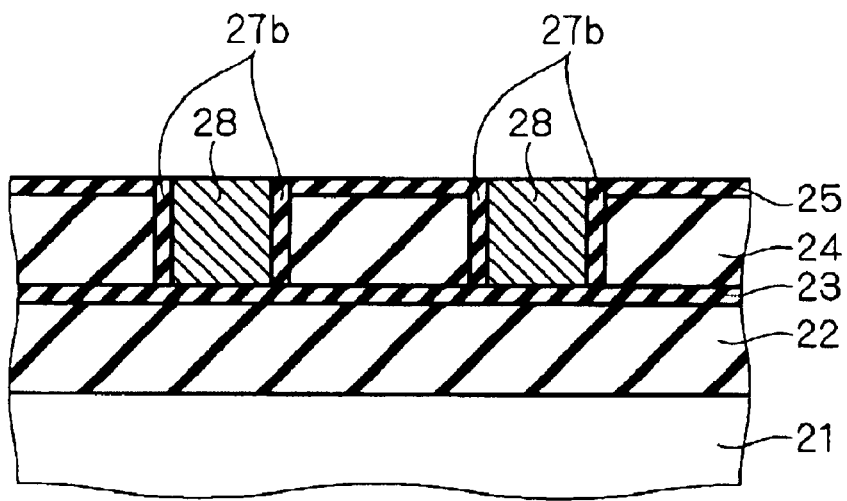
Figure 13:
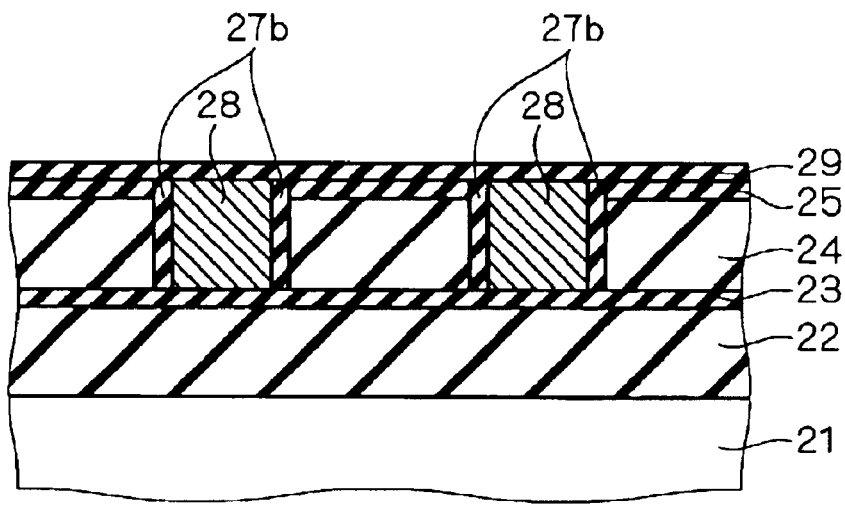
FIG. 13 is a view showing the semiconductor device according to the second embodiment.
Figure 14:
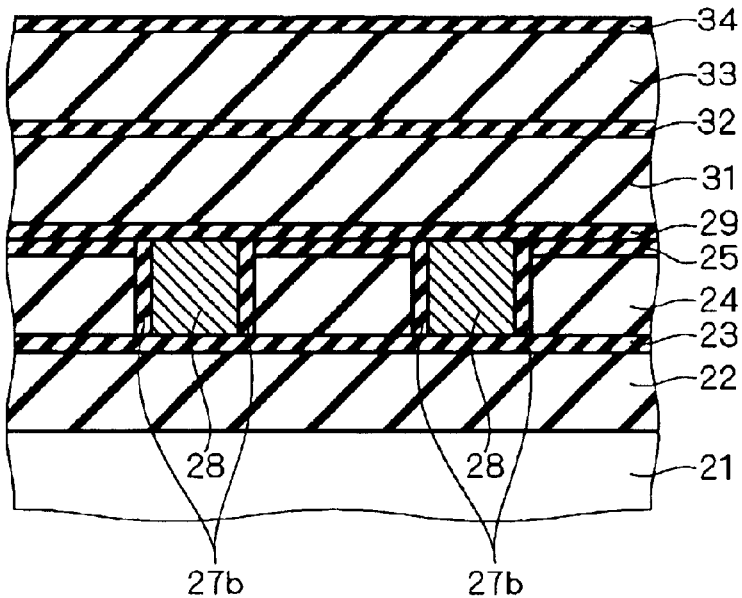
FIGS. 14 to 17 are views showing one step of a method of manufacturing a semiconductor device according to a third embodiment.

FIGS. 8 to 12 are views showing a method of manufacturing a semiconductor device according to the present embodiment and FIG. 13 is a view showing the semiconductor device obtained by the manufacturing method. In the present embodiment, a process flow for forming a copper wiring to be one layer will be described. A silicon carbide film containing oxygen atoms or oxygen atoms and nitrogen atoms is also applied to the first etching stop film 3 and the first hard mask film 5 according to the first embodiment. Furthermore, the formation of the first barrier metal 6 in the first embodiment is omitted. Instead, the silicon carbide film containing oxygen atoms or oxygen atoms and nitrogen atoms is formed as a side wall film along a wall surface in a wiring trench 7a. Other respects are the same as in the process flow according to the first embodiment shown in FIGS. 1 to 6. Description will be sequentially given with reference to FIG. 8 and the succeeding drawings.

Figure 8:
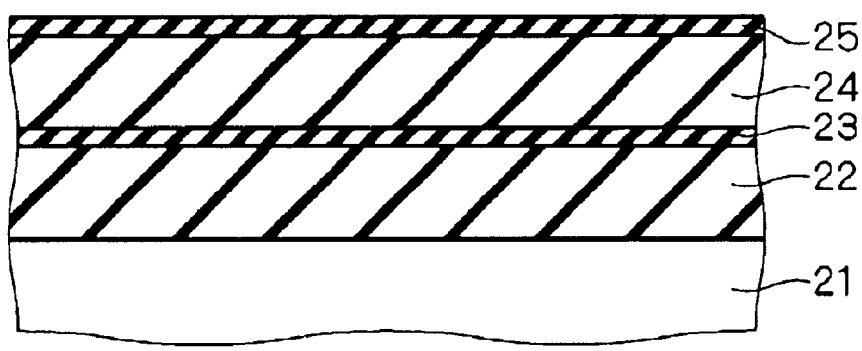
FIGS. 8 to 12 are views showing one step of a method of manufacturing a semiconductor device according to a second embodiment.

First of all, a lower insulating layer 22 including an element (not shown) such as a transistor is formed on a substrate 21 such as a silicon substrate. Then, a first etching stop film 23, a first low permittivity interlayer insulating film 24 and a first hard mask film 25 are formed on the lower insulating layer 22 (FIG. 8). Also in the present embodiment, a structure having the substrate 21 and the lower insulating layer 22 is regarded as a lower structure of a wiring formation layer.

In the present embodiment, as described above, the first etching stop film 23 and the first hard mask film 25 are silicon carbide films having a content ratio of oxygen atoms or oxygen atoms and nitrogen atoms set to 30 atomic % or more. Even if the silicon carbide film contains oxygen atoms or oxygen atoms and nitrogen atoms, it has an etching stop function and a hard mask function. Therefore, such a substitution can be carried out.

Moreover, at least one of various insulating films in the first embodiment is employed for the first low permittivity interlayer insulating film 24.

Figure 9:
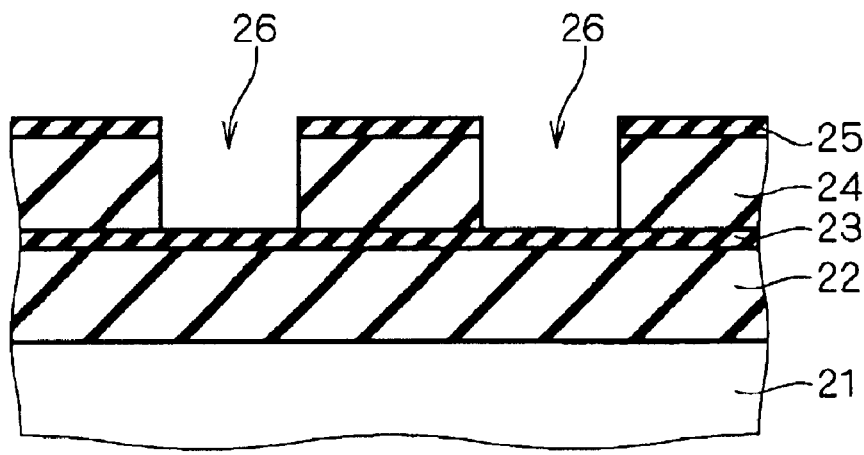

Next, the first hard mask film 25 is subjected to patterning by photolithography and the first low permittivity interlayer insulating film 24 is subjected to dry etching by using the patterned first hard mask film 25 as a mask, thereby forming a wiring trench 26 (FIG. 9).

Figure 10:
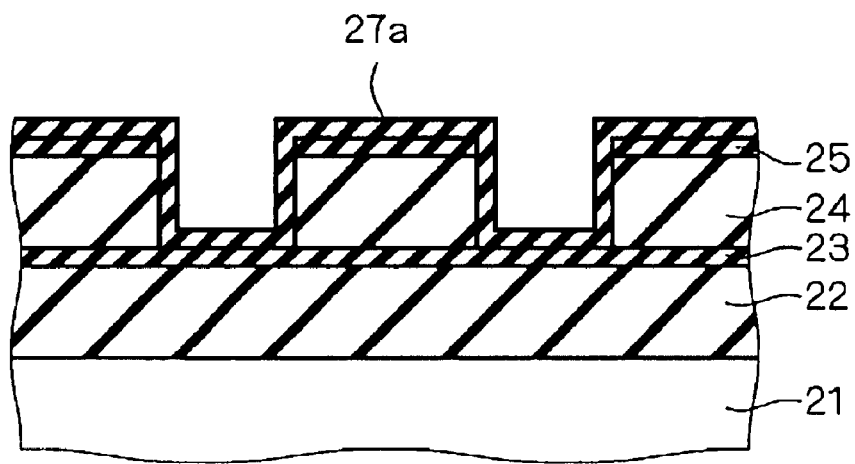

Subsequently, a first insulating film 27a for side wall formation is provided by using, as a material, a silicon carbide film having a content ratio of oxygen atoms or oxygen atoms and nitrogen atoms set to 30 atomic % or more to cover the whole surface of the structure in FIG. 9 such that the silicon carbide film is formed over a wall surface in the wiring trench 26 (FIG. 10).

Then, the first insulating film 27a for side wall formation is subjected to anisotropic dry etching and etch back is carried out to leave a portion which is provided in contact with a side wall portion in the wiring trench 26. Consequently, a first side wall film 27b is formed (FIG. 11).

Next, a first copper wiring 28 is formed and a portion provided above the first hard mask film 25 is removed by CMP. Consequently, the wiring trench 26 is filled with the first copper wiring 28 through the first side wall film 27b to be a side wall portion (FIG. 12). Then, the silicon carbide film having a content ratio of oxygen atoms or oxygen atoms and nitrogen atoms set to 30 atomic % or more is formed as a first copper diffusion preventive film 29 in contact with an upper surface of the first copper wiring 28 (FIG. 13).

In such a copper wiring structure, the silicon carbide film according to the present invention has the sufficient copper diffusion preventing function. Therefore, the copper film is not in contact with the first low permittivity interlayer insulating film 24 so that the copper wiring can be formed without using a barrier metal.

More specifically, according to the semiconductor device in accordance with the present embodiment, all of the first etching stop film 23, the first side wall film 27b and the first copper diffusion preventive film 29 are silicon carbide films having the content ratio of oxygen atoms or oxygen atoms and nitrogen atoms set to 30 atomic % or more.

Accordingly, the silicon carbide film containing oxygen atoms or oxygen atoms and nitrogen atoms is provided in contact with upper and lower surfaces in addition to a side surface of the first copper wiring 28 in the sectional view, and copper can be more reliably prevented from being diffused around the first copper wiring 28. More specifically, since the first copper diffusion preventive film 29 is formed on the upper surface of the first copper wiring 28, the upward diffusion of the copper can be prevented. Moreover, since the first side wall film 27b is formed on a side surface in the wiring trench 26, the diffusion of the copper into the first low permittivity interlayer insulating film 24 can be prevented on the periphery of the side of the wiring trench 26. Furthermore, since the first etching stop film 23 formed on the lower surface of the first copper wiring 28 is also a silicon carbide film containing oxygen atoms or oxygen atoms and nitrogen atoms, the downward diffusion of the copper, that is, the diffusion of the copper into the lower insulating layer 22 can be prevented.

Moreover, since the first side wall film 27b is formed along the wall surface in the wiring trench 26, it is not necessary to form a barrier metal for preventing the copper diffusion around the first copper wiring 28. The barrier metal is not required so that the volume of the first copper wiring 28 can be increased. For example, the first side wall film 27b is not provided on a bottom surface in the wiring trench 26 differently from the first barrier metal 6 in the first embodiment. Correspondingly, it is possible to increase the volume of the first copper wiring 28.

In addition, the barrier metal is not provided on the bottom surface in the wiring trench 26 so that a contact resistance of a connecting portion can also be decreased. Although the connecting portion with an element in the lower structure is not provided on the first copper wiring 28 in FIGS. 8 to 13, such a connecting portion is provided in some cases. In those cases, a part of the first etching stop film 23 in the wiring trench 26 may be further etched in the stage of FIG. 9 to provide a connecting hole in the lower insulating layer 22. Through subsequent steps, thus, a connecting hole having a side wall film can be formed and a connecting portion having a surface surrounded by the silicon carbide film can be formed by burying copper therein. In the case in which such a connecting portion is provided, a contact resistance of the connecting portion and an element in the lower structure can be decreased.

From the foregoing, the resistance of the first copper wiring 28 can be more reduced.

In the present embodiment, moreover, the first low permittivity interlayer insulating film 24 is first formed and the wiring trench 26 is then formed therein in order to form the first copper wiring 28. Consequently, while a so-called damascene process can be carried out, the present invention is not restricted thereto.

<Third Embodiment>

The present embodiment is a variant of the semiconductor device and the method of manufacturing the semiconductor device according to the second embodiment, in which another copper wiring is formed.

Figure 16:
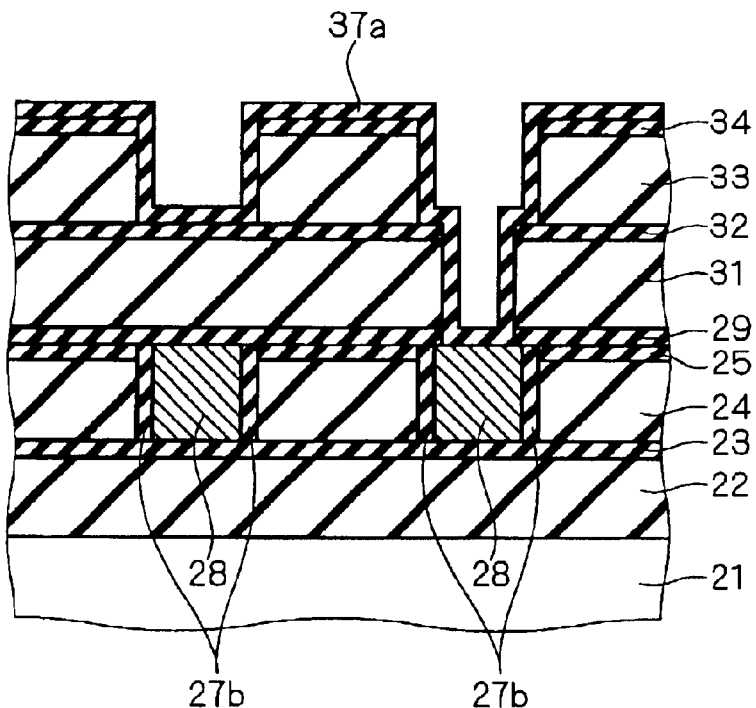
Figure 17:
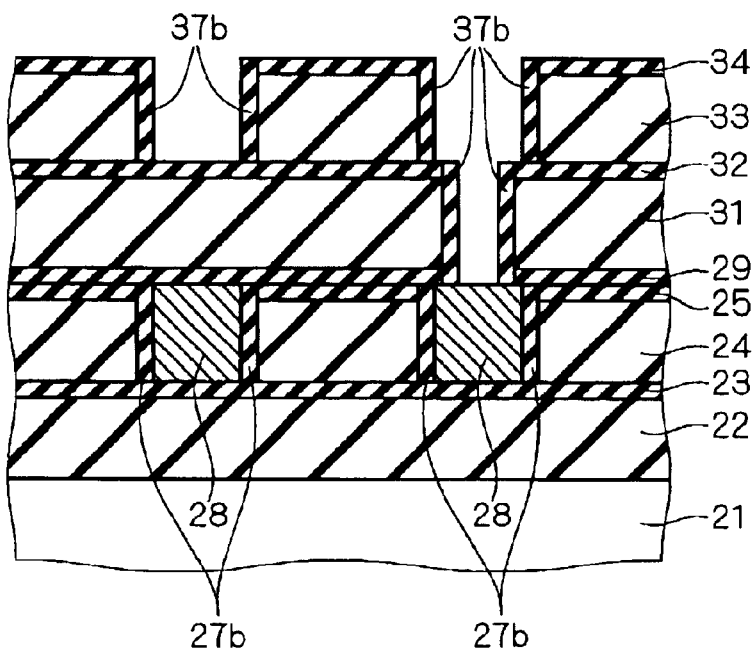
Figure 18:
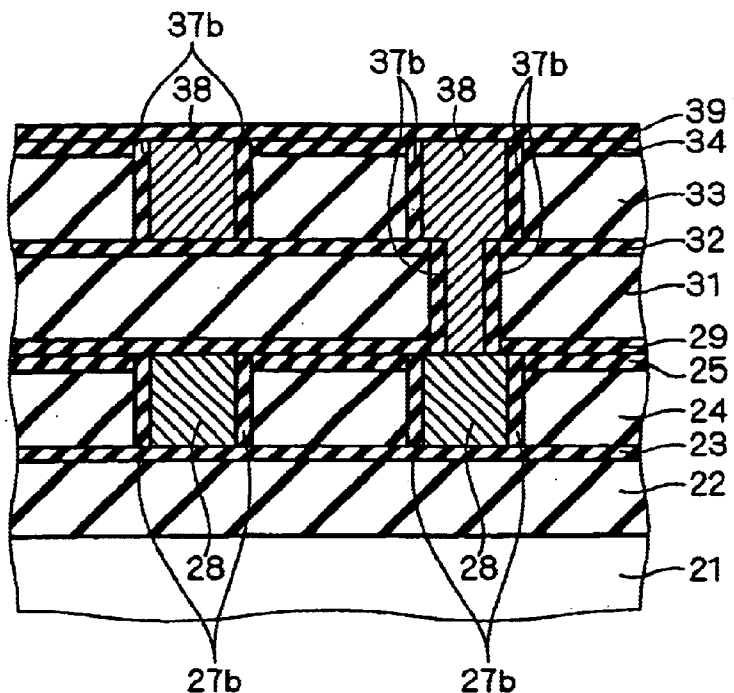
FIG. 18 is a view showing the semiconductor device according to the third embodiment.
Figure 19:
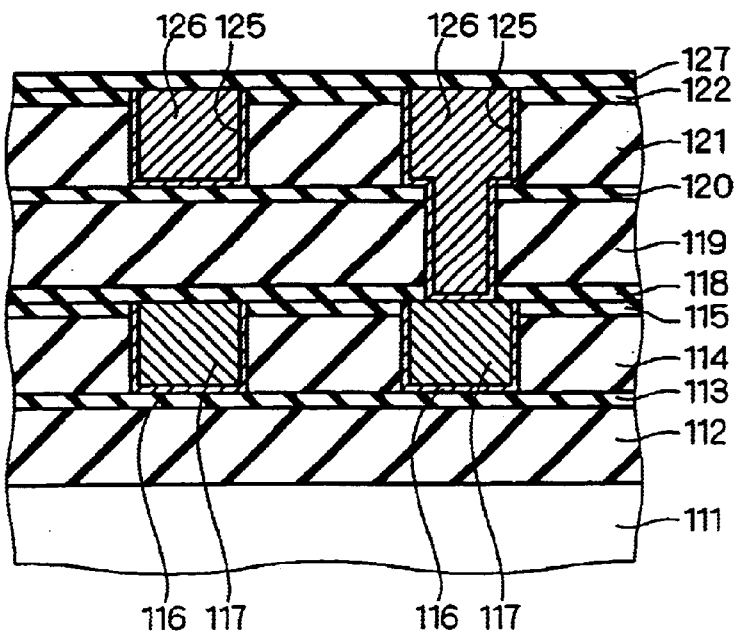
FIG. 19 is a view showing a semiconductor device having a buried copper wiring structure according to a conventional example.

FIGS. 14 to 17 are views showing a method of manufacturing a semiconductor device according to the present embodiment, and FIG. 18 is a view showing the semiconductor device obtained by the manufacturing method. In a process flow shown in FIGS. 14 to 18, a film is further formed in addition to the structure of FIG. 13 and a second copper wiring is formed.

Also in the present embodiment, a silicon carbide film containing oxygen atoms or oxygen atoms and nitrogen atoms is applied to the second etching stop film 10 and the second hard mask film 12 according to the first embodiment. Furthermore, the formation of the second barrier metal 15 according to the first embodiment is omitted. Instead, the silicon carbide film containing oxygen atoms or oxygen atoms and nitrogen atoms is formed as a side wall film along wall surfaces of a wiring trench 14 and a connecting hole 13. Other respects are the same as in the process flow of FIGS. 3 to 6 according to the first embodiment. Description will be sequentially given with reference to FIG. 14 and the succeeding drawings.

First of all, a second low permittivity interlayer insulating film 31, a second etching stop film 32, a third low permittivity interlayer insulating film 33 and a second hard mask film 34 are sequentially formed on the structure obtained at the steps described above (FIG. 14).

As described above, in the present embodiment, the silicon carbide film containing oxygen atoms or oxygen atoms and nitrogen atoms is also employed for the second etching stop film 32 and the second hard mask film 34. The silicon carbide film containing oxygen atoms or oxygen atoms and nitrogen atoms also has an etching stop function and a hard mask function. Therefore, such a substitution can be carried out.

Moreover, the same various low permittivity interlayer insulating films as the first low permittivity interlayer insulating film 24 are employed for the second and third low permittivity interlayer insulating films 31 and 33.

Figure 15:
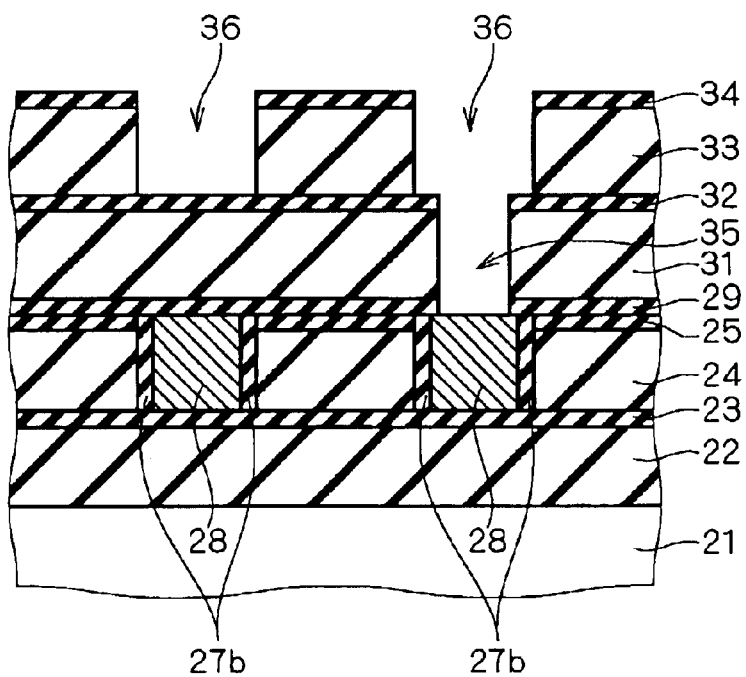

Next, the second hard mask film 34 is subjected to patterning by photolithography and the third low permittivity interlayer insulating film 33 is subjected to dry etching by using the patterned second hard mask film 34 as a mask, thereby forming a wiring trench 36. Moreover, a part of the second etching stop film 32 exposed to the wiring trench 36 is subjected to patterning by the photolithography and the second low permittivity interlayer insulating film 31 and a first copper diffusion preventive film 29 are subjected to dry etching by using the patterned second etching stop film 32 as a mask, thereby forming a connecting hole 35 (FIG. 15).

The second etching stop film 32 is formed in a position corresponding to a depth of the wiring trench 36. Accordingly, in the case in which the second and third low permittivity interlayer insulating films 31 and 33 are regarded as one interlayer insulating film, it can be supposed that the second etching stop film 32 is provided in course of the formation of the same interlayer insulating film.

Subsequently, a second insulating film 37a for side wall formation is provided by using, as a material, the silicon carbide film having a content ratio of oxygen atoms or oxygen atoms and nitrogen atoms set to 30 atomic % or more to cover the whole surface of the structure shown in FIG. 15 such that the silicon carbide film is formed on wall surfaces in the wiring trench 36 and the connecting hole 35 (FIG. 16).

Then, the second insulating film 37a for side wall formation is subjected to anisotropic dry etching and etch back is carried out to leave a portion which is provided in contact with side wall portions in the wiring trench 36 and the connecting hole 35. Consequently, a second side wall film 37b is formed (FIG. 17).

Next, a second copper wiring 38 is formed and a portion provided above the second hard mask film 34 is removed by CMP. Consequently, the wiring trench 36 and the connecting hole 35 are filled with the second copper wiring 38 through the second side wall film 37b to be a side wall portion. Then, the silicon carbide film having a content ratio of oxygen atoms or oxygen atoms and nitrogen atoms set to 30 atomic % or more is formed as a second copper diffusion preventive film 39 in contact with an upper surface of the second copper wiring 38 (FIG. 18).

According to the semiconductor device in accordance with the present embodiment, the silicon carbide film is also employed for the second copper diffusion preventive film 39 provided in contact with the second copper wiring 38 and contains oxygen atoms or oxygen atoms and nitrogen atoms in 30 atomic % or more. In case of a multilayer interconnection, consequently, it is possible to improve the function of the silicon carbide film for preventing copper from being diffused from a copper wiring. Thus, it is possible to obtain a semiconductor device which maintains a long lifetime until a dielectric breakdown is caused by the diffusion of the copper.

According to the method of manufacturing a semiconductor device in accordance with the present embodiment, moreover, it is possible to manufacture a semiconductor device having the advantages described above.

In the present embodiment, moreover, the second and third low permittivity interlayer insulating films 31 and 33 are first provided and the wiring trench 14 and the connecting hole 13 are then provided therein in order to form the second copper wiring 38. Consequently, a so-called damascene process can be carried out and the present invention is not restricted thereto.

According to the semiconductor device in accordance with the present embodiment, moreover, all of the second etching stop film 32, the second side wall film 37b and the second copper diffusion preventive film 39 are silicon carbide films having the content ratio of oxygen or oxygen and nitrogen set to 30 atomic % or more.

Accordingly, the silicon carbide film containing oxygen or oxygen and nitrogen is provided in contact with upper and lower surfaces in addition to a side surface of the second copper wiring 38 in the sectional view, and copper can be more reliably prevented from being diffused around the second copper wiring 38. More specifically, since the second copper diffusion preventive film 39 is formed on the upper surface of the second copper wiring 38, the upward diffusion of the copper can be prevented. Moreover, since the second side wall film 37b is formed along wall surfaces in the wiring trench 36 and the connecting hole 35, the diffusion of the copper into the second and third low permittivity interlayer insulating films 31 and 33 can be prevented on the periphery of the sides of the wiring trench 36 and the connecting hole 35. Furthermore, since the second etching stop film 32 formed under the second copper wiring 38 is also a silicon carbide film containing oxygen atoms or oxygen atoms and nitrogen atoms, the downward diffusion of the copper, that is, the diffusion of the copper into the second low permittivity interlayer insulating film 31 can be prevented.

Moreover, since the second side wall film 37b is formed along the wall surfaces in the wiring trench 36 and the connecting hole 35, it is not necessary to form a barrier metal for preventing the copper diffusion around the second copper wiring 38. The barrier metal is not required so that the volume of the second copper wiring 38 can be increased. For example, the second side wall film 37b is not provided on bottom surfaces in the wiring trench 36 and the connecting hole 35 differently from the second barrier metal 15 in the first embodiment. Correspondingly, it is possible to increase the volume of the second copper wiring 38.

In addition, the barrier metal is not provided on the bottom surfaces in the wiring trench 36 and the connecting hole 35. Consequently, a contact resistance of a connecting portion of the second copper wiring 38 and the first copper wiring 28 can also be decreased.

From the foregoing, the resistance of the second copper wiring 38 can be more reduced.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
   an interlayer insulating film;
   an electric conductor containing copper as a main component and having a surface containing copper; and
   a silicon carbide film, wherein said silicon carbide film is provided between said electric conductor and said interlayer insulation film and in direct contact with said surface containing copper of said electric conductor, and said silicon carbide film contains oxygen atoms and nitrogen atoms in a summed amount of 30 atomic % or more.

2. The semiconductor device according to claim 1, wherein said surface containing copper is an upper surface of said electric conductor.

3. The semiconductor device according to claim 1, wherein said surface containing copper is a side surface of said electric conductor.

4. The semiconductor device according to claim 1, wherein said surface containing copper is a lower surface of said electric conductor.

5. The semiconductor device according to claim 1, wherein said silicon carbide film contains oxygen atoms and nitrogen atoms in a summed amount of 30 to 50 atomic %.

6. The semiconductor device according to claim 1, wherein said silicon carbide film further contains hydrogen atoms.

* * * * *